(12) United States Patent
Lim

(10) Patent No.: US 11,622,176 B1
(45) Date of Patent: Apr. 4, 2023

(54) IMAGE SENSOR COMPRISING BJT PIXEL CIRCUIT AND IMAGE SENSING SYSTEM APPLYING THE IMAGE SENSOR

(71) Applicant: PixArt Imaging Inc., Hsin-Chu (TW)

(72) Inventor: Wooi Kip Lim, Penang (MY)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 17/572,585

(22) Filed: Jan. 10, 2022

(51) Int. Cl.
| | |
|---|---|
| *H01L 27/146* | (2006.01) |
| *H04N 25/75* | (2023.01) |
| *H03K 17/94* | (2006.01) |
| *H04N 25/771* | (2023.01) |

(52) U.S. Cl.
CPC ........... *H04N 25/75* (2023.01); *H03K 17/943* (2013.01); *H04N 25/771* (2023.01)

(58) Field of Classification Search
CPC ....... H01L 17/146; H04N 5/369; H04N 5/376
USPC .......................................... 250/208.1, 214 R
See application file for complete search history.

(56) References Cited

U.S. PATENT DOCUMENTS

| | | | | |
|---|---|---|---|---|
| 2007/0139992 A1* | 6/2007 | Nitta | ...................... | G11C 16/26 365/63 |
| 2017/0070688 A1 | 3/2017 | Pang | | |

\* cited by examiner

*Primary Examiner* — Que Tan Le
(74) *Attorney, Agent, or Firm* — Winston Hsu

(57) ABSTRACT

An image sensor comprising a BJT pixel circuit, a biasing circuit and a comparator. The BJT pixel circuit comprises a BJT; a charging selection circuit, configured to control a first storage capacitor to be charged in a first reset time and to control a second storage capacitor to be charged to a second reset time; a discharging selection circuit, configured to control the first storage capacitor to be discharged by the BJT in a first exposure time to generate a first output voltage, and to control the second storage capacitor to be discharged by the BJT in a second exposure time to generate a second output voltage; a biasing circuit, configured to provide voltage decreasing and voltage increasing to the second output voltage to generated adjusted images; and a comparator, configured to compare the first output voltage and the adjusted voltages.

20 Claims, 6 Drawing Sheets

IMAGE SENSOR COMPRISING BJT PIXEL CIRCUIT AND IMAGE SENSING SYSTEM APPLYING THE IMAGE SENSOR

BACKGROUND OF THE INVENTION

1. Field of the Invention

The present invention relates to an image sensor and an image sensing system applying the image sensor, and particularly relates an image sensor which can detect a motion without storing the whole image and an image sensing system applying the image sensor.

2. Description of the Prior Art

For conventional motion detection, every new image will be compared to previous image. If some pixels show significant difference between these two images then a motion signal will be triggered. For example, an image T1 is background of the environment and the image sensor senses an image T2 when there an object crosses a sensing region thereof. In such case, the image T1 and the image T2 are compared (image T1−image T2), some pixels show significant difference between these two images, thus motion is detected.

However, in such operation, after shutter exposure, every pixel signal passes through an amplifier, then digitized by ADC and sent to digital core for further processing. Also, the image T1 (the background image) will be stored in the memory. Therefore, if the pixel array is 30×30 and the ADC is an 8 bits ADC, a 900 bytes memory is needed to store the image T1. Additionally, the digital core will access to this memory to get image T1 then compared with new image T2. Therefore, a large memory and complexity computation are needed.

SUMMARY OF THE INVENTION

Therefore, one objective of the present invention is to provide an image sensor which can reduce the memory size and the computation complexity of motion detection.

Another objective of the present invention is to provide an image sensing system which can reduce the memory size and the computation complexity of motion detection.

One embodiment of the present invention discloses an image sensor comprising a BJT pixel circuit, a biasing circuit and a comparator. The BJT pixel circuit comprises a photodiode; a BJT, controlled by the photodiode; a first storage capacitor; a second storage capacitor; a charging selection circuit, configured to control the first storage capacitor to be charged to a first predetermined voltage level in a first reset time and to control the second storage capacitor to be charged to a second predetermined voltage level in a second reset time; a discharging selection circuit, configured to control the first storage capacitor to be discharged by the BJT in a first exposure time to generate a first output voltage, and to control the second storage capacitor to be discharged by the BJT in a second exposure time to generate a second output voltage; and a readout selection circuit, configured to read the first output voltage and the second output voltage in a second readout time; a biasing circuit, configured to provide voltage decreasing according to the second output voltage and a first detection voltage to generate a first adjusted voltage, and configured to provide voltage increasing according to the second output voltage and a second detection voltage to generate a second adjusted voltage; and a comparator, configured to generate a first comparison result according to the first output voltage and the first adjusted voltage, and configured to generate a second comparison result according to the first output voltage and the second adjusted voltage.

Another embodiment of the present invention discloses an image system comprising the above-mentioned image sensor. In such image system, the comparison results of the comparator are used for determining whether motion exists or not. Also, the light source emits light in the first exposure time and the second exposure time.

In view of above-mentioned embodiments, since the whole image is not limited to be stored and the motion detection can be performed via comparing different image signals in a pixel, the memory size can be reduced and computation can be simplified.

These and other objectives of the present invention will no doubt become obvious to those of ordinary skill in the art after reading the following detailed description of the preferred embodiment that is illustrated in the various figures and drawings.

DETAILED DESCRIPTION

Several embodiments are provided in following descriptions to explain the concept of the present invention. The term "first", "second", "third" in following descriptions are only for the purpose of distinguishing different one elements, and do not mean the sequence of the elements. For example, a first device and a second device only mean these devices can have the same structure but are different devices.

Figure 1:
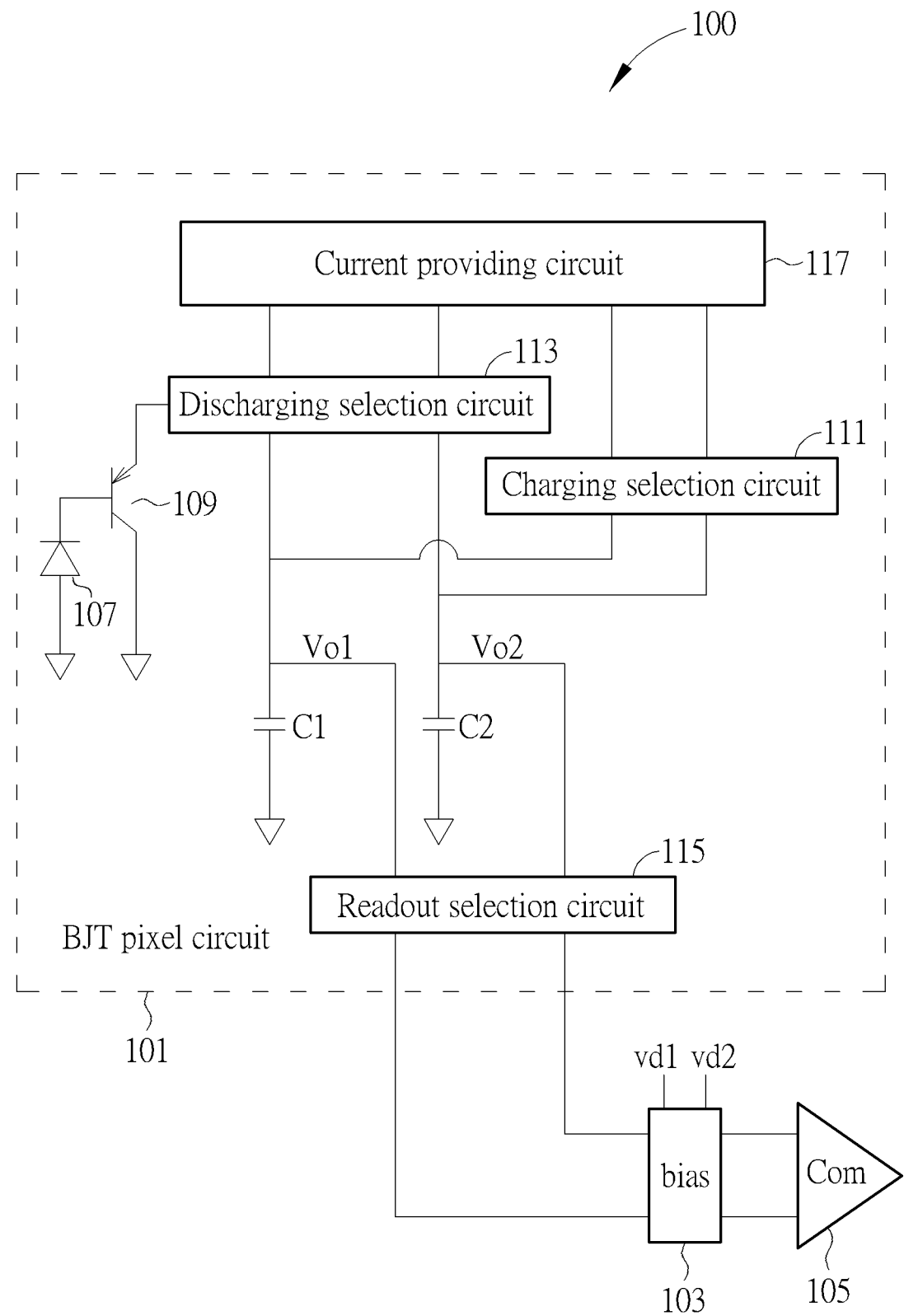
FIG. 1 is a block diagram illustrating an image sensor according to one embodiment of the present invention.

FIG. 1 is a block diagram illustrating an image sensor 100 according to one embodiment of the present invention. As illustrated in FIG. 1, the image sensor 100 comprises a BJT pixel circuit 101, a biasing circuit 103 and a comparator 105. The BJT pixel circuit comprises: a photodiode 107, a BJT 109, a charging selection circuit 111, a discharging selection circuit 113, a readout selection circuit 115, a first storage capacitor C1 and a second storage capacitor C2. The BJT 109 is controlled by the photodiode 107. The charging selection circuit 111 is configured to control the first storage capacitor C1 to be charged to a first predetermined voltage level in a first reset time and to control the second storage capacitor to be charged to a second predetermined voltage level in a second reset time. The discharging selection circuit 113 is configured to control the first storage capacitor C1 to be discharged by the BJT 109 in a first exposure time to generate a first output voltage Vo1, and to control the second storage capacitor C2 to be discharged by the BJT 109 in a second exposure time to generate a second output voltage Vo2. The readout selection circuit 115 is configured to output the first output voltage Vo1 in a first readout time and configured to output the first output voltage Vo1 and the second output voltage Vo2 in a second readout time. Please note in one embodiment, the readout selection circuit 115 outputs the first output voltage Vo1 and the second output voltage Vo2 in the second readout time, but does not output the first output voltage Vo1 in the first readout time.

In one embodiment, the photodiode 107 is integrated in the BJT 109. The BJT 109 is a PNP bipolar junction transistor and the photodiode 107 is integrated in the PN junction between the base and collector of the BJT 109. The emitter of the BJT 109 is coupled to the discharging selection circuit 113. In another embodiment, the photodiode 107 has a cathode and an anode. The cathode is coupled to the emitter of the BJT 109.

The biasing circuit 103, which receives the first output voltage Vo1 and the second output voltage Vo2 from the readout selection circuit 115, is configured to provide voltage decreasing according to the second output voltage Vo2 and a first detection voltage Vd1 to generate a first adjusted voltage, and configured to provide voltage increasing according to the second output voltage Vo2 and a second detection voltage Vd2 to generate a second adjusted voltage Va2.

The comparator 105 is configured to generate a first comparison result according to the first output voltage Vo1 and the first adjusted voltage Va1, and configured to generate a second comparison result according to the first output voltage Vo1 and the second adjusted voltage Va2. Details of the biasing circuit 103 and the comparator 105 will be described for more details later.

In one embodiment, the second readout time is after the first readout time. Further, in another embodiment, the first exposure time is after the first reset time, and the first readout time is after the first exposure time. Also, in this embodiment, the second reset time is after the first read out time, the second exposure time is after the second reset time, and the second readout time is after the second exposure time.

That is, the charging selection circuit 111 controls the first storage capacitor C1 to be charged to the first predetermined voltage level in the first reset time, then the discharging selection circuit 113 controls the first storage capacitor C1 to be discharged by the BJT 109 in the first exposure time to generate the first output voltage Vo1, and then the readout selection circuit 115 outputs the first output voltage Vo1 in the first readout time. After that, the charging selection circuit 111 controls the second storage capacitor C2 to be charged to the second predetermined voltage level in the second reset time, then the discharging selection circuit 113 controls the second storage capacitor C2 to be discharged by the BJT 109 in the second exposure time to generate the first output voltage Vo2, and then the readout selection circuit 115 outputs the second output voltage Vo1 and the second output voltage Vo2 in the second readout time.

Figure 2:
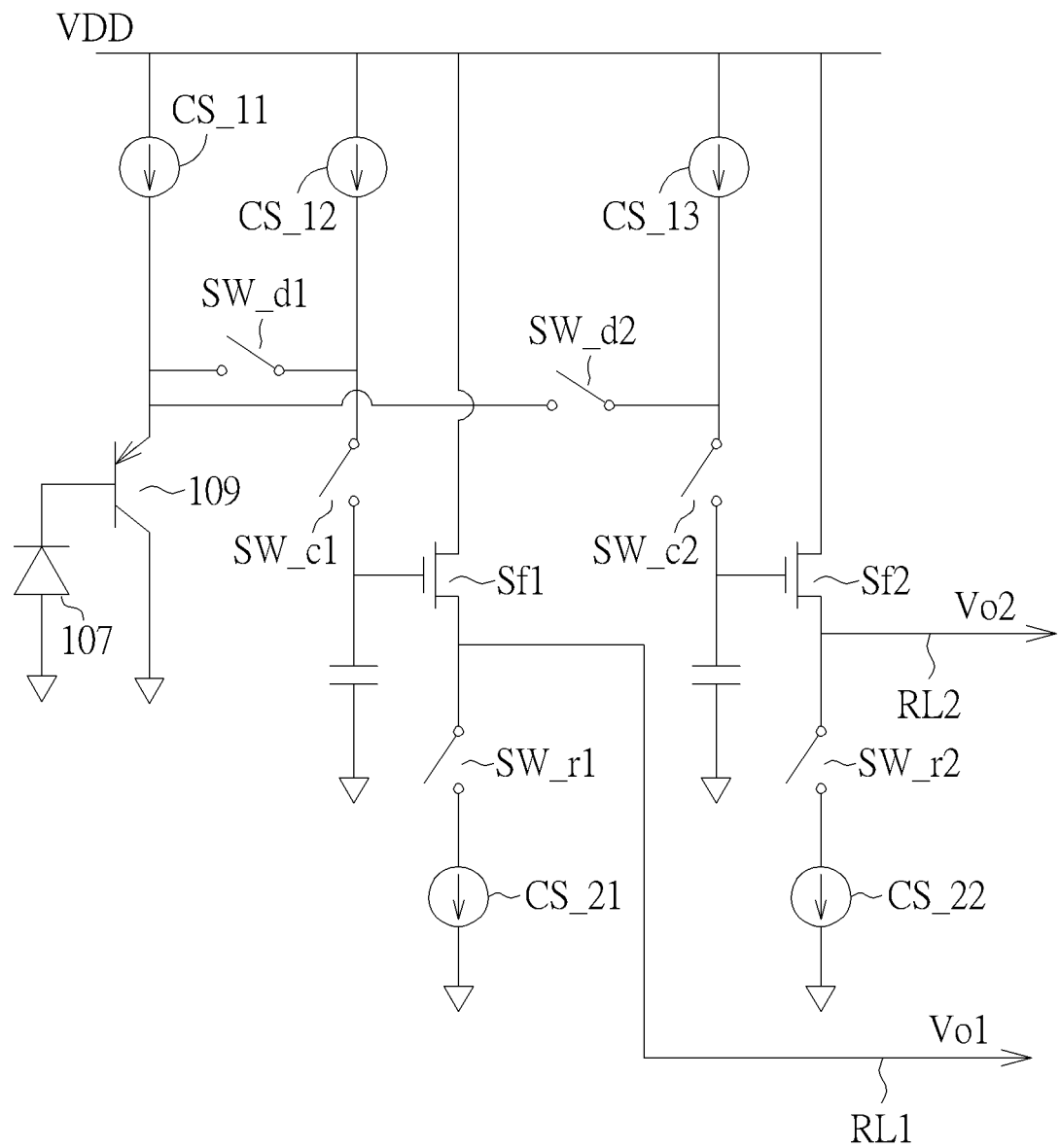
FIG. 2 is a circuit diagram illustrating a detail circuitry of the BJT pixel circuit illustrated in FIG. 1.

FIG. 2 is a circuit diagram illustrating a detail circuitry of the BJT pixel circuit illustrated in FIG. 1. Please note, the embodiment in FIG. 2 is only for example, any circuit which can perform the same function should also fall in the scope of the present invention. For the perspicuity of drawings, some symbols in FIG. 1 are not shown in FIG. 2.

The charging selection circuit 111 in FIG. 1 comprises the first charging switch SW_c1 and the second charging switch SW_c2 in FIG. 2. Also, the discharging selection circuit 113 comprises the first discharging switch SW_d1 and the second discharging switch SW_d2 in FIG. 2. The first charging switch SW_c1 is coupled between the first discharging switch SW_d1 and the first storage capacitor C1. The first charging switch SW_c1 is conducted in the first reset time and in the first exposure time, and is non-conducted in the first read out time. Further, the second charging switch SW_c2 is coupled between the second discharging switch SW_d2 and the second storage capacitor C2. The second charging switch SW_c2 is conducted in the second reset time and in the second exposure time, and is non-conducted in the second read out time.

The readout selection circuit 115 comprises a first read switch SW_r1, a first source follower Sf1, a second read switch SW_r2, and a second source follower Sf2. The first read switch SW_r1 is coupled to the first storage capacitor C1 and a first read out line RL1. The first read switch SW_r1 is conducted in the first read out time and the second read out time. The first source follower Sf1 comprises a gate terminal coupled to the first storage capacitor C1, a source terminal coupled to the first readout line RL1 via the first read switch SW_r1, and a drain terminal coupled to a power source VDD. The second read switch SW_r2 is coupled to the second storage capacitor C2 and a second read out line RL2. The second read switch SW_r2 is conducted in the first read out time and the second read out time. The second source follower Sf2 comprises a gate terminal coupled to the second storage capacitor C2, a source terminal coupled to the second readout line RL2 via the second read switch SW_r2, and a drain terminal coupled to the power source VDD. The switches in FIG. 2 can be implemented by transistors, such as PMOSs or NMOSs.

In one embodiment, the current providing circuit 117 in FIG. 1 comprises the current sources CS_11, CS_12 and CS_13 in FIG. 2. Also, in one embodiment, the read out selection circuit 115 further comprises the current sources CS 21, and CS 22, but not limited.

Figure 3:
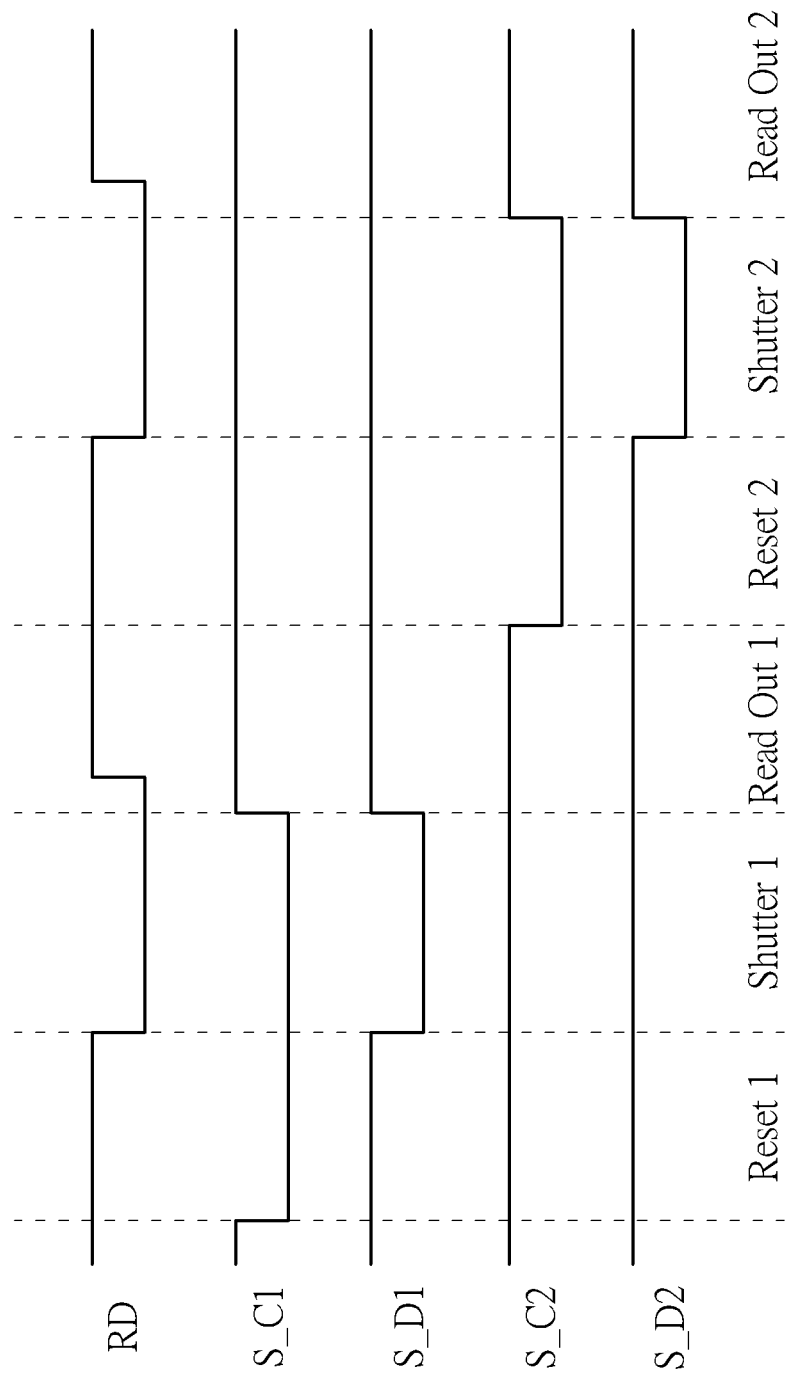
FIG. 3 is a wave chart illustrating operations of the BJT pixel circuit illustrated in FIG. 2.

FIG. 3 is a wave chart illustrating operations of the BJT pixel circuit illustrated in FIG. 2. FIG. 3 comprises signals S_C1, S_D1, S_C2, S_D2, RD, which respectively control the components illustrated in FIG. 2. Also, the relations between the signals in FIG. 3 and the components which the signals controlled are illustrated in following Table 1.

TABLE 1

| Signals in FIG.3 | Components in FIG.2 |
| --- | --- |
| S_C1 | SW_c1 |
| S_D1 | SW_d1 |
| S_C2 | SW_c2 |
| S_D2 | SW_d2 |
| RD | SW_r1, SW_r2 |

In one embodiment, the first charging switch SW_c1, the second charging switch SW_c2, the first discharging switch SW_d1 and the second charging switch SW_d2 in FIG. 2 are PMOSes having gate terminals receives the signals S_C1, S_D1, S_C2 and S_D2 in FIG. 3, thus are conducted when a corresponding signal has a low logic value and are non-conducted when a corresponding signal has a high logic value. Also, the first reading switch SW_r1 and the second reading switch SW_r2 in FIG. 2 are NMOSes having gate terminals receives the signal RD, thus are conducted when a corresponding signal has a high logic value and are non-conducted when a corresponding signal has a low logic value.

Also, the Reset 1, Shutter 1, Read Out 1, Reset 2, Shutter 2, Read Out 2 in FIG. 3 respectively represent the first reset time, the first exposure time, the first read out time, the second reset time, the second exposure time, and the second read out time.

In Reset 1, the first storage capacitor C1 is reset to have a first predetermined voltage level. After Reset 1, the first discharging switch SW_d1 is conducted in Shutter 1, the BJT 109 discharges the first storage capacitor C1 until end of Shutter 1 (S_D1=1). Signal S_D1 is then set to the high logic value to store the image signal (or named a light signal) acquired in Shutter 1 into the first storage capacitor C1. For more detail, in Shutter 1, the BJT 109 discharges the first predetermined voltage level and the discharging rate is a function of light intensity of the light received by the photo diode 107.

Besides, in the Read out 1, the signal RD is set to the high logic value, the first output voltage Vo1 is read by the comparator 105 in FIG. 1 for comparison. But this read out is skipped since the second storage capacitor C2 still waits its image signal.

In Reset 2, the second storage capacitor C2 is reset to have a second predetermined voltage level. After Reset 2, the second discharging switch SW_d2 is conducted in Shutter 2, the BJT 109 discharges the second storage capacitor C2 until end of Shutter 2 (S_D2=1). S_C2 is then set to the high logic value to store the image signal acquired in Shutter 2 into the second storage capacitor C2. So that the first storage capacitor C1 and the second storage capacitor C1 has two image signals collected at different time.

As above-mentioned, the biasing circuit 103 in FIG. 1 is configured to provide voltage decreasing according to the second output voltage Vo2 and a first detection voltage Vd1 to generate a first adjusted voltage Va1, and configured to provide voltage increasing according to the second output voltage Vo2 and a second detection voltage Vd2 to generate a second adjusted voltage Va2. Details of the biasing circuit 103 are illustrated as below, according to one embodiment of the present invention. In following embodiment, the first detection voltage and the second detection voltage are the same detection voltage Vdec.

Figure 4:
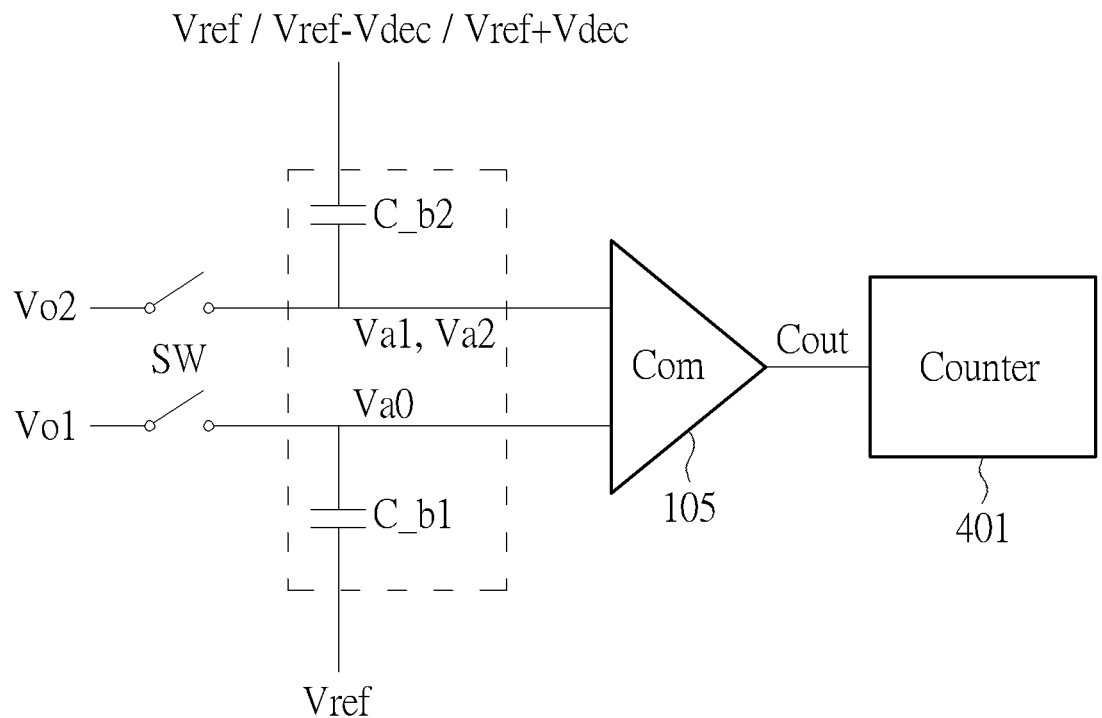
FIG. 4 is a circuit diagram illustrating a detail circuitry of the biasing circuit illustrated in FIG. 2.

AS shown in FIG. 4, the biasing circuit 103 comprises a first capacitor C_b1 and a second capacitor C_b2. The first capacitor C_b1 comprises a first terminal for receiving the first output voltage Vo1, and a second terminal for receiving the reference voltage Vref. The second capacitor C_b2 comprises a first terminal for receiving the second output voltage Vo2, and a second terminal for receiving the reference voltage Vref, the reference signal minus the first detection voltage Vref−Vdec and the reference signal plus the second detection voltage Vref+Vdec in the different time.

In such case, the biasing circuit 103 biases the first output voltage for the reference voltage Vref to generate a first voltage Va0. Also, the biasing circuit 103 biases the second output voltage Vo2 for the reference voltage Vref to generate a second voltage, decreases the second voltage with the first detection voltage Vdec to generate the first adjusted voltage Va1, and increases the second voltage with the second detection voltage Vdec to generate the second adjusted voltage Va2 in different time.

Figure 5:
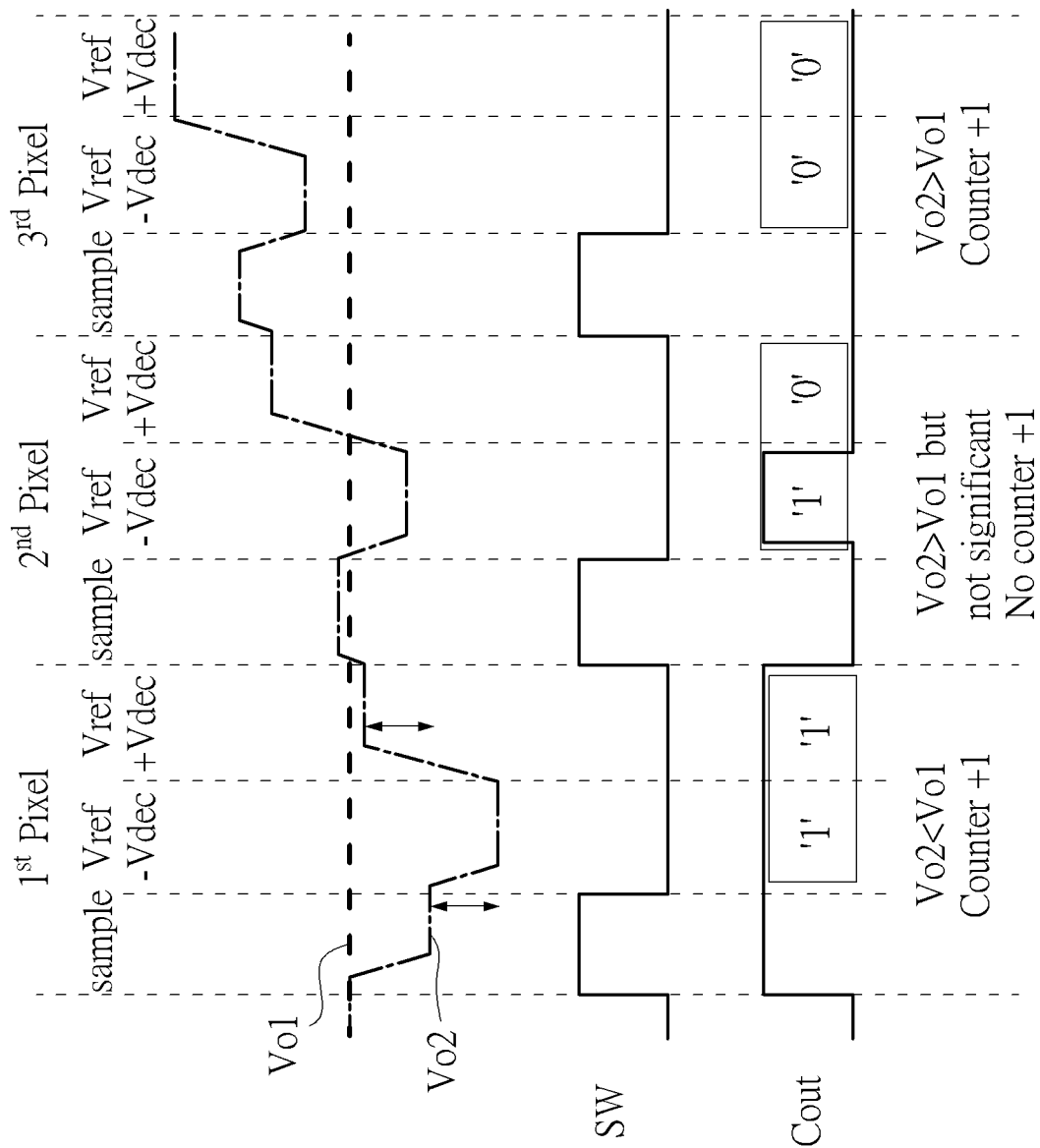
FIG. 5 is a schematic diagram illustrating operations of the biasing circuit illustrated in FIG. 4.

The biasing circuit 103 in FIG. 4 further comprises a comparator 105 and a counter 401. Also, FIG. 5 is a schematic diagram illustrating operations of the comparator 105 and the counter 401. As above-mentioned, the first storage capacitor C1 and the second storage capacitor C2 store images signals at different time, which can be used but not limited for motion detection. Therefore, if an object crosses the image sensor, the second storage capacitor C2 collects a different image signal from the first storage capacitor C1. As shown in FIG. 4, the first output voltage Vo1 from the first storage capacitor C1 and the second output voltage Vo2 from the second storage capacitor C2 are transferred to the comparator 105 to check the difference by turning on the switches SW (i.e., conducted). The switches SW can be integrated to the readout selection circuit 115 in FIG. 1. The first output voltage Vo1 and the second output voltage Vo2 are respectively stored on the first capacitor Cb1 and the second capacitor Cb2 with the bias voltage which is the reference voltage Vref, on the other plate of the first capacitor C_b1 and the second capacitor C_b2.

After the switches SW are turned off (i.e., non-conducted), the bias voltage received by the second capacitor Cb2 changes from Vref to Vref-Vdec and Vref+Vdec in sequence. If the output Cout of the comparator 105 remains as '0' or '1' when the bias voltages are Vref-Vdec and Vref+Vdec, that means the second output voltage Vo2 has significant difference from the first output voltage Vo1. Thus the count of the counter 401 is triggered to increase by 1.

In FIG. 5, an example of the comparator 105 outputs with three different sets of image signals for three pixels. Each pixel has the structure illustrated in FIG. 1. For the 1st pixel checking, the first output voltage Vo1 is brighter than the second output voltage Vo2, and the output Cout is "11" for both Vref-Vdec and Vref+Vdec. This means the second output voltage Vo2 has significant difference compared to the first output voltage Vo1.

For the 2nd pixel, the second output voltage Vo2 is just slightly brighter than the first output voltage Vo1, thus the output Cout is "10". That is, the output Cout is 1 for Vref-Vdec, and the output Cout is 0 for Vref+Vdec. This means the second output voltage Vo2 has no significant difference compared to the first output voltage Vo1.

For the 3rd pixel checking, the second output voltage Vo2 is brighter than the first output voltage Vo1, and the Cout is "00" for both Vref-Vdec and Vref+Vdec. This means the second output voltage Vo2 has significance difference compared to the first output voltage Vo1.

The counter 401 counts the total count of all pixels in the whole pixel array that have significant difference (i.e. with comparator output of "11" or "00") between two continuous images. Once the count number exceeds a preset predetermined threshold value, then a motion is detected.

In view of above-mentioned descriptions, the comparator 105 is configured to generate a first comparison result according to the first output voltage Vo1 and the first adjusted voltage Va1 (corresponding to Vref−Vdec), and configured to generate a second comparison result according to the first output voltage Vo1 and the second adjusted voltage Va2 (corresponding to Vref+Vdec). The first comparison result and the second comparison result are for determining whether motion exists or not The voltage Vref-Vdec and Vref+Vdec as shown in FIG. 5 are can be adjusted. If the detection voltage Vdec is lower, it means the comparator 105 is more sensitive to change its output state, but more motion detection noise may exist. The threshold value of the counter number which means the motion is detected can be adjusted as well. If the detection voltage Vdec is lower, it means the motion detection is more sensitive, however, similarly, more motion detection noise may exist. Therefore, the detection voltage Vdec and the threshold value can be optimized to allow the system to operate reliably with fewer noises.

Figure 6:
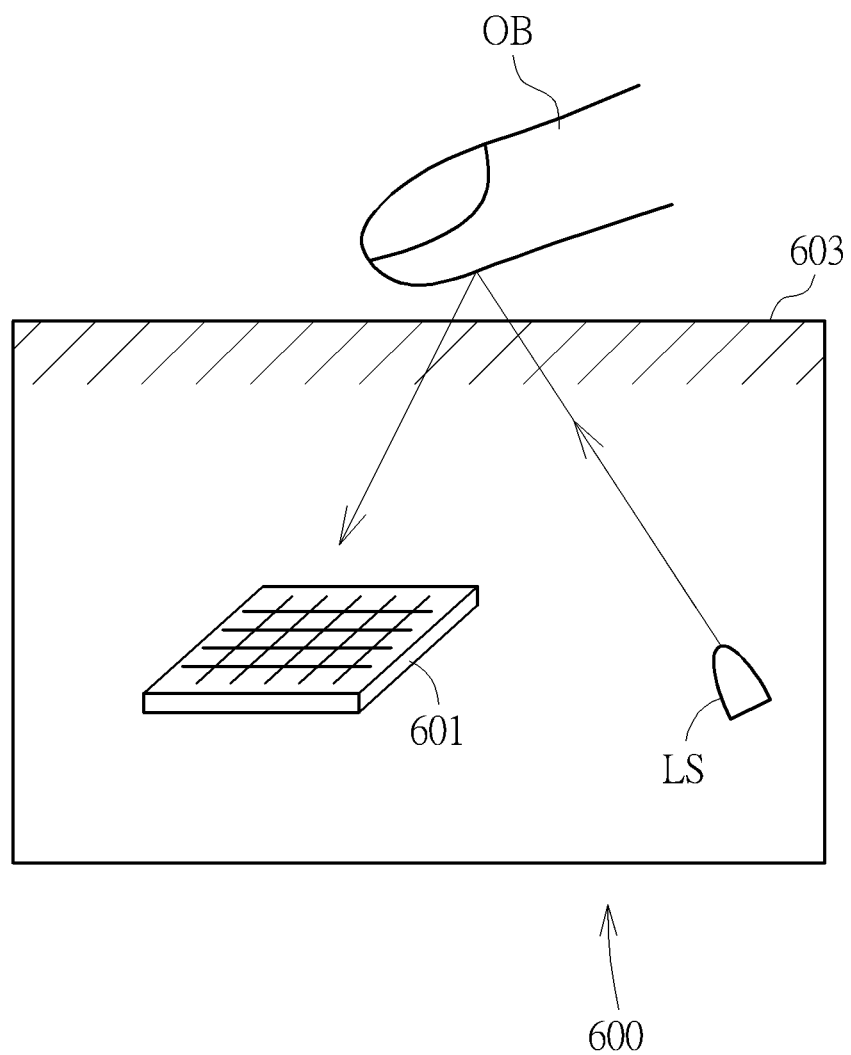
FIG. 6 is a schematic diagram illustrating an image sensing system according to one embodiment of the present invention.

The above-mentioned image sensor can be applied to an image sensing system such as an optical navigation device. FIG. 6 is a schematic diagram illustrating an image sensing system according to one embodiment of the present invention. As illustrated in FIG. 6, the image sensing system 600, which is an optical navigation device in this example, comprises a light source LS and an image sensor 601. The image sensor 601 comprises a pixel array which comprises a plurality of BJT pixel circuits. Each of the BJT pixel circuit comprises the structures illustrated in FIG. 1. Also, the image sensor 601 also comprises biasing circuits 103, comparators 105 and counters 401 corresponding to the BJT pixel circuits.

The light source LS emits light outward the surface 603 of the image sensing system 600. Therefore, if an object Ob such as a finger moves across the surface 603, the image sensor 601 senses an image generated according to the reflected light of light from the light source LS. In such case, image signals stored in the above-mentioned first storage capacitor C1 and the second storage capacitor C2 may have difference, thus the motion of the object Ob can be detected in this way. Please note, since the image signals stored the above-mentioned first storage capacitor C1 and the second storage capacitor C2 are used for detecting motions, the light source LS emits light when the image signal of the first storage capacitor C1 is generated (i.e., the first exposure time) and emits light as well when the image signal of the second storage capacitor C2 is generated (i.e., the second exposure time).

In one embodiment, only a portion for detecting the motion is active when the image sensor 601 is in a sleep mode, and the whole image sensor 601 is awaken when the motion is detected. It will be appreciated that the image sensing system is not limited to the example illustrated in FIG. 6. The image sensing system can be any other optical device, such as an optical mouse.

In view of above-mentioned embodiments, since the whole image is not limited to be stored and the motion detection can be performed via comparing different image signals in a pixel, the memory size can be reduced and computation can be simplified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor, comprising:
   a BJT pixel circuit, comprising:
     a photodiode;
     a BJT, controlled by the photodiode;
     a first storage capacitor;
     a second storage capacitor;
     a charging selection circuit, configured to control the first storage capacitor to be charged to a first predetermined voltage level in a first reset time and to control the second storage capacitor to be charged to a second predetermined voltage level in a second reset time;
     a discharging selection circuit, configured to control the first storage capacitor to be discharged by the BJT in a first exposure time to generate a first output voltage, and to control the second storage capacitor to be discharged by the BJT in a second exposure time to generate a second output voltage; and
     a readout selection circuit, configured to read the first output voltage and the second output voltage in a second readout time;
   a biasing circuit, configured to provide voltage decreasing according to the second output voltage and a first detection voltage to generate a first adjusted voltage, and configured to provide voltage increasing according to the second output voltage and a second detection voltage to generate a second adjusted voltage; and
   a comparator, configured to generate a first comparison result according to the first output voltage and the first adjusted voltage, and configured to generate a second comparison result according to the first output voltage and the second adjusted voltage.

2. The image sensor of claim 1, wherein the readout selection circuit is configured to read the first output voltage in a first readout time, wherein the second readout time is after the first readout time.

3. The image sensor of claim 2, wherein the first exposure time is after the first reset time, and the first readout time is after the first exposure time, wherein the second reset time is after the first readout time, the second exposure time is after the second reset time, and the second readout time is after the second exposure time.

4. The image sensor of claim 1, wherein the charging selection circuit comprises:
   a first charging switch, coupled between the discharging selection circuit and the first storage capacitor, wherein the first charging switch is conducted in the first reset time and in the first exposure time, and is non-conducted in the first read out time; and
   a second charging switch, coupled between the discharging selection circuit and the second storage capacitor, wherein the second charging switch is conducted in the second reset time and in the second exposure time, and is non-conducted in the second read out time.

5. The image sensor of claim 4,
   wherein the discharging selection circuit comprises:
   a first discharging switch, coupled between the BJT and the first charging switch, wherein the first discharging switch is non-conducted in the first reset time and in the first read out time, and is conducted in the first exposure time; and
   a second discharging switch, coupled between the BJT and the second charging switch, wherein the second discharging switch is non-conducted in the second reset time and in the second read out time, and is conducted in the second exposure time.

6. The image sensor of claim 1, wherein the read out selection circuit comprises:
   a first read switch, coupled to the first storage capacitor and a first read out line, wherein the first read switch is conducted in the first read out time and the second read out time.

7. The image sensor of claim 6, wherein the read out selection circuit further comprises:
   a first source follower, comprising a gate terminal coupled to the first storage capacitor, a source terminal coupled to the first readout line via the first read switch, and a drain terminal coupled to a power source.

8. The image sensor of claim 1, wherein the first detection voltage and the second detection voltage are the same.

9. The image sensor of claim 1, wherein the biasing circuit further biases the first output voltage for a reference voltage to generate a first voltage, wherein the biasing circuit biases the second output voltage for the reference voltage to generate a second voltage, decreases the second voltage with the first detection voltage to generate the first adjusted voltage, and increases the second voltage with the second detection voltage to generate the second adjusted voltage in different time.

10. The image sensor of claim 9, wherein the biasing circuit comprises:

a first capacitor, comprising a first terminal for receiving the first output voltage, and a second terminal for receiving the reference voltage; and a second capacitor, comprising a first terminal for receiving the second output voltage, and a second terminal for receiving the reference voltage, the reference signal minus the first detection voltage and the reference signal plus the second detection voltage in the different time.

11. An image sensing system, comprises:
a light source;
an image sensor, comprising:
  a BJT pixel circuit, comprising:
    a photodiode;
    a BJT, controlled by the photodiode;
    a first storage capacitor;
    a second storage capacitor;
    a charging selection circuit, configured to control the first storage capacitor to be charged to a first predetermined voltage level in a first reset time and to control the second storage capacitor to be charged to a second predetermined voltage level in a second reset time; and
    a discharging selection circuit, configured to control the first storage capacitor to be discharged by the BJT in a first exposure time to generate a first output voltage, and to control the second storage capacitor to be discharged by the BJT in a second exposure time to generate a second output voltage; and
    a readout selection circuit, configured to read the first output voltage and the second output voltage in a second readout time;
  a biasing circuit, configured to provide voltage decreasing according to the second output voltage and a first detection voltage to generate a first adjusted voltage, and configured to provide voltage increasing according to the second output voltage and a second detection voltage to generate a second adjusted voltage; and
  a comparator, configured to generate a first comparison result according to the first output voltage and the first adjusted voltage, and configured to generate a second comparison result according to the first output voltage and the second adjusted voltage, wherein the first comparison result and the second comparison result is for determining whether motion exists or not;
wherein the light source emits light in the first exposure time and the second exposure time.

12. The image sensing system of claim 11, wherein the readout selection circuit is configured to read the first output voltage in a first readout time, wherein the second readout time is after the first readout time.

13. The image sensing system of claim 12, wherein the first exposure time is after the first reset time, and the first readout time is after the first exposure time, wherein the second reset time is after the first read out time, the second exposure time is after the second reset time, and the second readout time is after the second exposure time.

14. The image sensing system of claim 11, wherein the charging selection circuit comprises:
  a first charging switch, coupled between the discharging selection circuit and the first storage capacitor, wherein the first charging switch is conducted in the first reset time and is non-conducted in the first exposure time; and
  a second charging switch, coupled between the discharging selection circuit and the second storage capacitor, wherein the second charging switch is conducted in the second reset time and is non-conducted in the second exposure time.

15. The image sensing system of claim 14, wherein the discharging selection circuit comprises:
  a first discharging switch, coupled between the BJT and the first charging switch, wherein the first discharging switch is non-conducted in the first reset time and is conducted in the first exposure time; and
  a second discharging switch, coupled between the BJT and the second charging switch, wherein the second discharging switch is non-conducted in the second reset time and is conducted in the second exposure time.

16. The image sensing system of claim 11, wherein the read out selection circuit comprises:
  a first read switch, coupled to the first storage capacitor and a read out line, wherein the first read switch is conducted in the first read out time and the second read out time.

17. The pixel circuit as claimed in claim 16, wherein the read out selection circuit further comprises:
  a first source follower, comprising a gate terminal coupled to the first storage capacitor, a source terminal coupled to the readout line via the first read switch, and a drain terminal coupled to a power source.

18. The image sensing system of claim 11, wherein the first detection voltage and the second detection voltage are the same.

19. The image sensing system of claim 11, wherein the biasing circuit further biases the first output voltage for a reference voltage to generate a first voltage, wherein the biasing circuit biases the second output voltage for the reference voltage to generate a second voltage, decreases the second voltage with the first detection voltage to generate the first adjusted voltage, and increases the second voltage with the second detection voltage to generate the second adjusted voltage in different time.

20. The image sensing system of claim 19, wherein the biasing circuit comprises:
  a first capacitor, comprising a first terminal for receiving the first output voltage, and a second terminal for receiving the reference voltage; and
  a second capacitor, comprising a first terminal for receiving the second output voltage, and a second terminal for receiving the reference voltage, the reference signal minus the first detection voltage and the reference signal plus the second detection voltage in the different time.

* * * * *